(12) United States Patent
Deak et al.

(10) Patent No.: US 10,948,554 B2
(45) Date of Patent: Mar. 16, 2021

(54) MAGNETORESISTIVE SENSOR PACKAGE WITH ENCAPSULATED INITIALIZATION COIL

(71) Applicant: MultiDimension Technology Co., Ltd., Zhangjiagang (CN)

(72) Inventors: James Geza Deak, Zhangjiagang (CN); Xiaojun Zhang, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 28 days.

(21) Appl. No.: 16/093,064

(22) PCT Filed: Apr. 10, 2017

(86) PCT No.: PCT/CN2017/079948
§ 371 (c)(1),
(2) Date: Oct. 11, 2018

(87) PCT Pub. No.: WO2017/177877
PCT Pub. Date: Oct. 19, 2017

(65) Prior Publication Data
US 2019/0120915 A1 Apr. 25, 2019

(30) Foreign Application Priority Data
Apr. 11, 2016 (CN) .......................... 201620296367.7

(51) Int. Cl.
*G01R 33/09* (2006.01)
*H01L 43/02* (2006.01)
(Continued)

(52) U.S. Cl.
CPC .......... *G01R 33/09* (2013.01); *H01L 23/3114* (2013.01); *H01L 24/48* (2013.01);
(Continued)

(58) Field of Classification Search
None
See application file for complete search history.

(56) References Cited

U.S. PATENT DOCUMENTS

| 5,952,825 A | 9/1999 | Wan |
| 2003/0094944 A1* | 5/2003 | Suzuki ................. G01R 33/093 324/252 |

(Continued)

FOREIGN PATENT DOCUMENTS

| CN | 1503001 A | 6/2004 |
| CN | 102298125 | 12/2011 |

(Continued)

OTHER PUBLICATIONS

"International Application No. PCT/CN2017079948, International Search Report and Written Opinion dated Jun. 30, 2017", (Jun. 30, 2017), 10 pgs.

(Continued)

*Primary Examiner* — Jermele M Hollington
*Assistant Examiner* — Suresh K Rajaputra
(74) *Attorney, Agent, or Firm* — Schwegman Lundberg & Woessner, P.A.

(57) ABSTRACT

A magnetoresistive sensor with encapsulated initialization coil comprises a packaging structure, at least one pair of sensor chips, a spiral initialization coil, a set of wire bonding pads, an ASIC specific integrated circuit and an encapsulation layer. The spiral initialization coil is located on a PCB substrate of the encapsulation structure. Each set of sensor chips comprises two sensor chips, wherein each of the sensor chips comprises two groups of magnetoresistive sensing unit strings. The magnetoresistive sensing unit strings located on the sensor chip are connected to form a magnetoresistive sensor bridge. The application specific integrated circuit, ASIC and the magnetoresistive sensor bridge are electrically interconnected. The sensor chips are (Continued)

located above the spiral initialization coil placed circumferentially along the surface of the spiral initialization coil. The wire bonding pad and the ASIC are electrically interconnected. This sensor design reduces the sensor hysteresis and offset generated by magnetic domains in flux concentrators. It is easy to manufacture at low cost.

16 Claims, 6 Drawing Sheets

(51) Int. Cl.
  *H01L 43/08* (2006.01)
  *H01L 23/00* (2006.01)
  *H01L 23/31* (2006.01)
(52) U.S. Cl.
  CPC ............. *H01L 43/02* (2013.01); *H01L 43/08* (2013.01); *H01L 2224/451* (2013.01); *H01L 2224/73265* (2013.01)

(56) References Cited

U.S. PATENT DOCUMENTS

| | | | |
|---|---|---|---|
| 2003/0141957 | A1 | 7/2003 | Bohlinger |
| 2004/0104724 | A1* | 6/2004 | Sato ................... G01R 33/0064 324/224 |
| 2004/0130323 | A1 | 7/2004 | Oohashi et al. |
| 2004/0189292 | A1 | 9/2004 | Kautz |
| 2012/0182010 | A1* | 7/2012 | Lammel ............. G01R 33/0035 324/244 |
| 2013/0335073 | A1* | 12/2013 | Deak ...................... G01D 5/145 324/207.21 |

FOREIGN PATENT DOCUMENTS

| | | |
|---|---|---|
| CN | 102483443 A | 5/2012 |
| CN | 102540113 A | 7/2012 |
| CN | 205581283 U | 9/2016 |
| EP | 0696357 A1 | 2/1996 |
| EP | 2682772 A1 | 1/2014 |
| WO | WO-95/23343 A1 | 8/1995 |
| WO | WO-2017177877 A1 | 10/2017 |

OTHER PUBLICATIONS

"European Application Serial No. 17781853.1, Supplementary European Search Report dated Nov. 12, 2019", 10 pgs.

"International Application No. PCT/CN2017/079948, International Preliminary Report on Patentability dated Oct. 25, 2018", (w/ English Translation), 12 pgs.

* cited by examiner

MAGNETORESISTIVE SENSOR PACKAGE WITH ENCAPSULATED INITIALIZATION COIL

PRIORITY CLAIM TO RELATED APPLICATIONS

This application is a U.S. national stage filing under 35 U.S.C. § 371 from International Application No. PCT/CN2017/079948, filed on 10 Apr. 2017, and published as WO2017/177877 on 19 Oct. 2017, which claims the benefit under 35 U.S.C. 119 to Chinese Application No. 201620296367.7, filed on 11 Apr. 2016, the benefit of priority of each of which is claimed herein, and which applications and publication are hereby incorporated herein by reference in their entirety.

TECHNICAL FIELD

The present invention relates to magnetic field sensors, and in particular, to a magnetoresistive sensor with an encapsulated initialization coil.

BACKGROUND ART

For a magnetoresistive sensor, hysteresis means that during repeated magnetization of a ferromagnet, changes in magnetic induction intensity of the magnet always lag behind magnetic field intensity of the magnet. Hysteresis is a phenomenon unique to ferromagnetic materials when the magnetic induction intensity varies with the magnetic field intensity. Magnetic domains refer to small areas inside a magnetic material that have different magnetic moment directions and sizes. When a ferromagnetic material reaches a magnetic saturation state, if a magnetization field is reduced, the magnetization intensity or magnetic induction intensity of a medium does not decrease along an initial magnetization curve, and the magnetization intensity or magnetic induction intensity lags behind changes in the magnetization field. Hysteresis will be reduced if all magnetic domains are arranged in the same direction in an initialization magnetic field.

As shown in FIG. 1, if a ferromagnetic object is misshaped or does not have a bias magnetic field to keep the ferromagnet in a single-magnetic domain state, the ferromagnetic material may be decomposed into magnetic domains, which will produce hysteresis. Single magnetic domain structures or aligned magnetic domains are required to reduce hysteresis and the direction of magnetization must be perpendicular to a sensing direction.

Hysteresis is caused by irreversible motion of magnetic domain walls and rotation of magnetization.

As shown in FIG. 2 and FIG. 3, an applied magnetic field H is applied at an angle with respect to a magnetization direction when H=0. It should be noted that when H is applied in a direction parallel to M (H=0), hysteresis is high. When H is applied in a direction perpendicular to M(0), hysteresis is very small. When H is applied to form a 90-degree angle with M(0), the direction of magnetization rotates continuously, rather than moving by a magnetic domain wall. Therefore, it is preferred that the magnetization direction is perpendicular to a sensing direction of a sensor.

As shown in FIG. 4 and FIG. 5, 10 denotes a sensor element, 20 denotes a flux concentrator, 30 denotes a sensitive axis, and 40 denotes a planned direction of an initialization magnetic field. After being exposed to a high magnetic field, the concentrator may demagnetize into a multi-magnetic domain state and show hysteresis. Therefore, in order to have low hysteresis, the flux concentrator needs to have its own magnetization direction perpendicular to the sensing direction. If a large magnetic field is applied in the initialization direction shown in the curve charts, the magnetic domains can be aligned, and the sensor can show low hysteresis again. Some companies apply coils to magnetic field sensors to solve this problem.

Packaging is critical to chips. A packaging technology also directly affects the performance of a chip, as does the design and manufacture of a PCB connected to the chip. At present, there are a variety of packaging formats for semiconductor chips, including Land Grid Array (LGA), (hip On Board) COB, Flip Chip, etc. The packaging formats are compatible with sensor chips and don't use a substrate, and there are other packaging methods using a substrate, such as hybrid packaging used in aviation and automobiles. Because of a wide variety of interfaces, desirable mechanical stability and heat dissipation characteristics, the LOA has attracted increasingly more attention and has been used more frequently. In a bare chip packaged using COB technology, a chip body and an I/O terminal are located above the crystal. During chip bonding, the bare chip is adhered onto the PCB with a conductive/thermal adhesive. After the adhesive has solidified, metal wires are connected to a welding zone of the I/O terminal of the chip and a bonding pad corresponding to the PCB respectively by using a wire-bonding machine under ultrasonic or hot-pressing effects. After test is passed, a resin adhesive is used for sealing. Compared with the COB, the chip structure and I/O terminals (solder bumps) of the Flip Chip are oriented downward. As I/O terminals are distributed across the surface of the entire chip, the Flip Chip has reached the peak in packaging density and processing speed. In particular, the Flip Chip can be processed by a means similar to the SMT technology, thereby being the ultimate direction of the chip packaging technology and high-density installation.

In the prior art, a US Patent with Publication Number of U.S. Pat. No. 5,952,825 A disclosed an integrated magnetic field sensing device, which has magnetic field sensing elements. A first spiral coil provides a setting and resetting function. Second and third coils are used to carry a current and produce magnetic fields useful for test, compensation, calibration, and feedback applications. However, setting a reset coil on a sensor chip increases the size of the sensor chip and adds additional layers, which will increase the complexity of the sensor chip.

Low-cost coils can be arranged on a PCB or a package substrate rather than on a silicon substrate. First, the size of the packaging will not be increased significantly; second, silicon chips are made as small as possible. The two factors have led to a new technology, that is, a low-cost method is implemented by using a high-performance sensor product with an encapsulated initialization coil.

SUMMARY OF THE INVENTION

In order to solve the foregoing problems, the Invention provides a low-cost packaging technology for magnetic field sensors, which provides an initialization coil for a sensor. The initialization coil is used to reduce hysteresis and offset of the sensor. In addition, the packaging of the present invention can also coexist with other common semiconductor manufacturing packaging technologies.

Specifically, the Invention provides a magnetoresistive sensor with an encapsulated initialization coil, including a packaging structure, at least one pair of sensor chips, a spiral initialization coil, a set of wire bonding pads and an encapsulation layer, wherein the packaging structure includes a substrate on which a conductor is patterned; the spiral initialization coil is located on the substrate. Each set of sensor chips includes two sensor chips, wherein each of the sensor chips includes two groups of magnetoresistive sensing unit strings. The magnetoresistive sensing unit strings located on the sensor chip are connected to form a magnetoresistive sensor bridge. The sensor chips are located above the spiral initialization coil and placed circumferentially along the surface of the spiral initialization coil. A magnetic field generated by the spiral initialization coil is perpendicular to the direction of induction sensing axis of the sensor chip.

The substrate of the packaging structure is a PCB.

Preferably, the spiral initialization coil is rectangular, the number of the sensor chips is one group, including two sensor chips, and the sensor chips are located on two symmetrical sides of the spiral initialization coil respectively to form a single sensing axis.

Preferably, the spiral initialization coil is square, the number of the sensor chips is two groups, including four sensor chips, and the sensor chips are located symmetrically and circumferentially along the surface of the spiral initialization coil respectively to form double sensing axes.

The spiral initialization coils have the same width, and gaps between the windings are the same.

The spiral initialization coil has a width of 0.12 mm, and the gap between the windings is 0.1 mm.

The magnetoresistive sensor with an encapsulated initialization coil further includes an ASIC specific integrated circuit, wherein said ASIC specific integrated circuit and said magnetoresistive sensor bridge are electrically interconnected, and the wire bonding pad and the ASIC specific integrated circuit are electrically interconnected.

The ASIC specific integrated circuit includes an ESD antistatic protection circuit.

The ASIC specific integrated circuit includes an ESD antistatic protection circuit and a processing circuit configured to calculate output of the magnetoresistive sensor bridge to output in a digital form.

The packaging structure is LGA packaging.

The encapsulation layer is made of a non-magnetic material, and the magnetoresistive sensor bridge is sealed in the encapsulation layer to form standard semiconductor encapsulation.

The non-magnetic material is plastic or ceramic.

The magnetoresistive sensor chip uses a magnetic layer or a permanent magnet to provide a bias field perpendicular to a free layer of sensor elements in the sensor chip, and the magnetic field generated by the initialization coil is parallel to the direction of the bias field of the free layer of the sensor elements in the sensor chip.

The spiral initialization coil is made of copper or aluminum.

The conductor is made of silver, copper or aluminum.

The conductor has a width in a range of 50-300 μm, the spacing between the conductors is 50-150 μm, and the conductor has a thickness of 10-200 μm.

The present invention has the following beneficial effects: the magnetoresistive sensor of the present invention can initialize a magnetic field by using a rapid current pulse such that the initialized magnetic field is perpendicular to a sensing direction of the sensor. The substrate in the present invention is a PCB, which is easy to manufacture at reduced manufacturing cost, and reduces the size of the magnetoresistive sensor.

BRIEF DESCRIPTION OF THE DRAWINGS

In order to describe the technical solution in the technology of the embodiments of the present invention more clearly, the accompanying drawings to be used in the descriptions about the embodiments are briefly introduced below. Obviously, the accompanying drawings in the following descriptions are only some embodiments of the present invention. Those of ordinary skill in the art can also obtain other accompanying drawings according to these accompanying drawings without creative efforts.

DETAILED DESCRIPTION

Preferred embodiments of the present invention are described in detail below with reference to the accompanying drawings, so that the advantages and features of the present invention can be more easily understood by those skilled in the art, so as to more clearly and definitely define the protection scope of the present invention.

Figure 1:
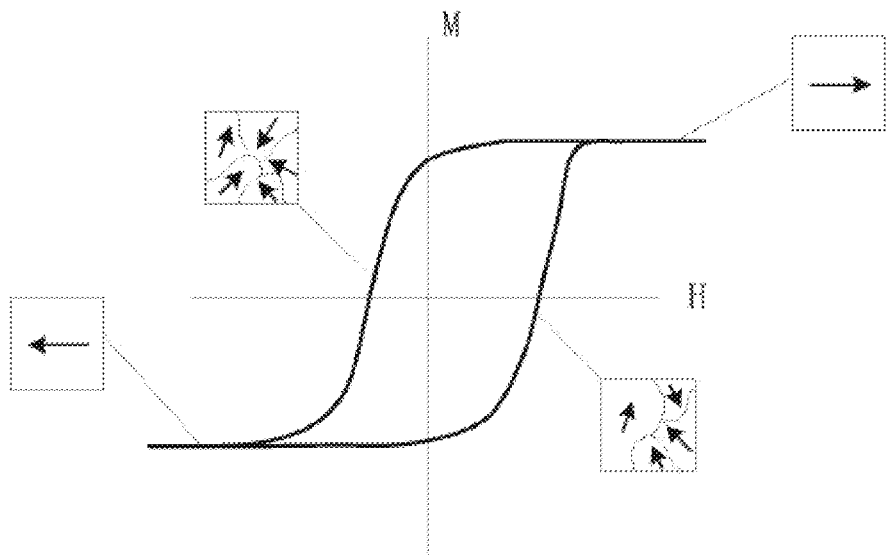
FIG. 1 is a schematic diagram of generation of hysteresis by multiple magnetic domains.
Figure 2:
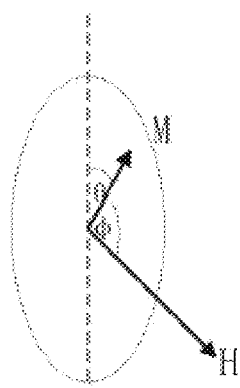
FIG. 2 is a schematic diagram of an included angle between an applied magnetic field and a direction of magnetization.
Figure 3:
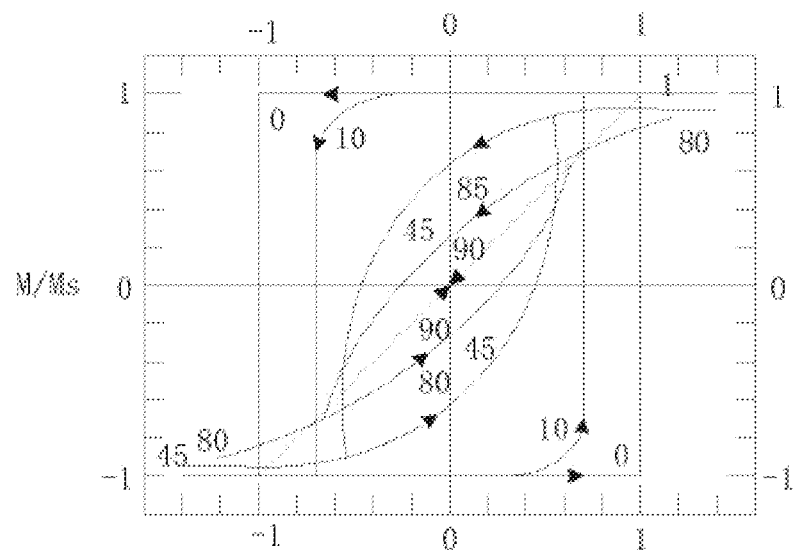
FIG. 3 is a schematic diagram of a relation between the included angle in FIG. 2 and the magnitude of hysteresis.
Figure 4:
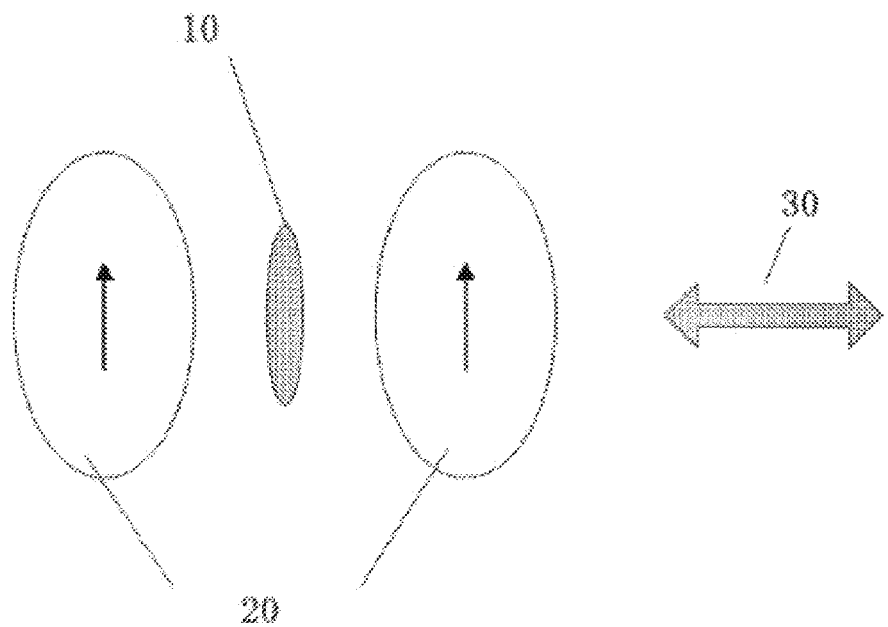
FIG. 4 is a schematic diagram of magnetic domains corresponding to small hysteresis generated after a large magnetic field is applied.
Figure 5:
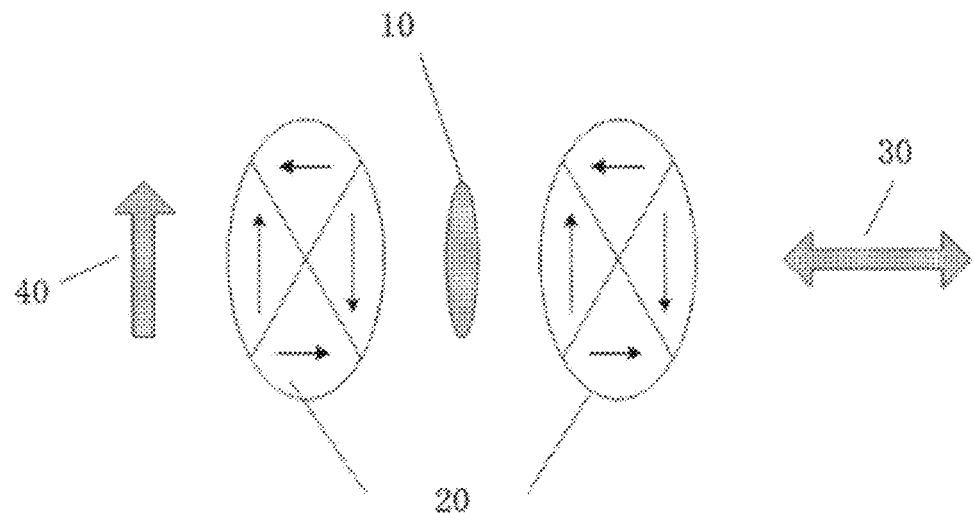
FIG. 5 is a schematic diagram of magnetic domains corresponding to hysteresis in a non-ideal case.
Figure 6:
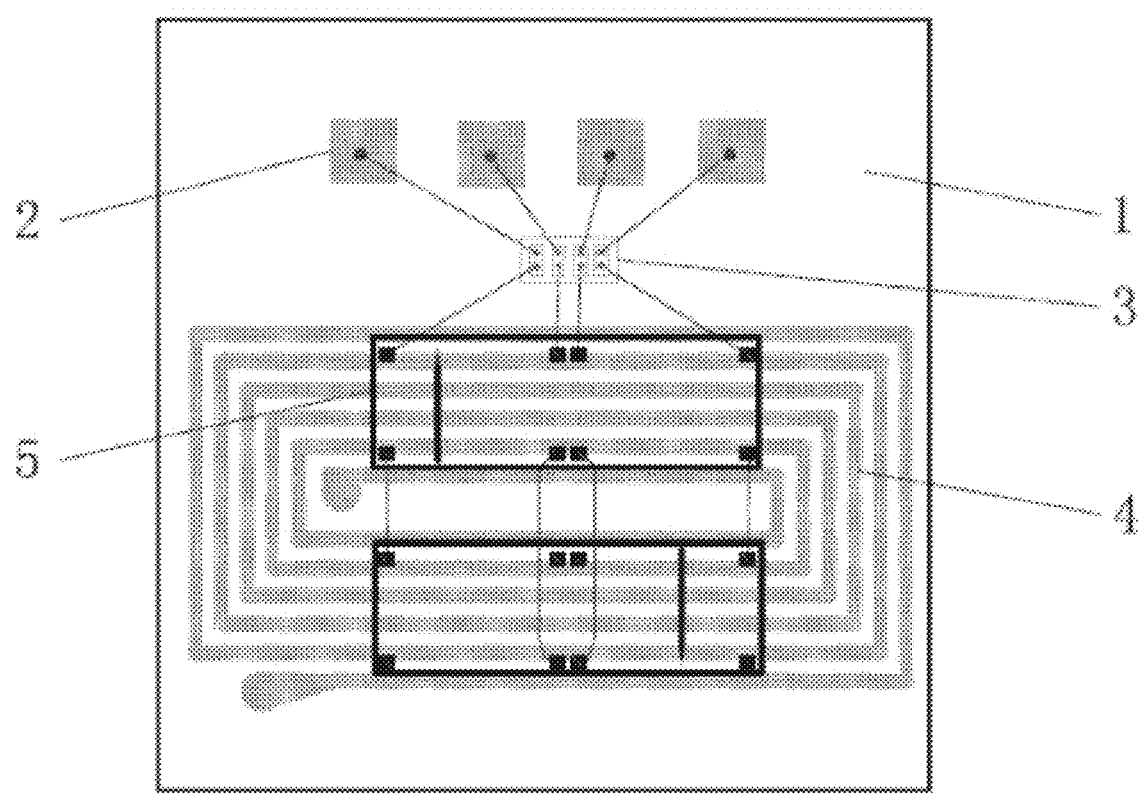
FIG. 6 is a block diagram of a magnetic field sensing device according to the present invention.

Referring to FIG. 6, FIG. 6 shows a top planar view of a magnetic field sensing device according to the present invention. As can be seen, the layout of its integrated circuit includes a packaging structure, at least one pair of sensor chips, a spiral initialization coil 4, a set of wire bonding pads 2 and an encapsulation layer. The packaging structure includes a PCB substrate 1 on which a conductor is patterned. The spiral initialization coil 4 is located on the PCB substrate. Each set of sensor chips includes two sensor chips 5. Each of the sensor chips includes two groups of magnetoresistive sensing unit strings, and the magnetoresistive sensing unit strings located on the two sensor chips are connected to form a magnetoresistive sensor bridge. The sensor chips 5 are located above the spiral initialization coil 4 and placed circumferentially along the surface of the spiral initialization coil. A magnetic field generated by the spiral initialization coil 4 is perpendicular to the direction of an sensing axis of the sensor chip 5.

The conductor has a width in a range of 50-300 μm, the spacing between the conductors is 50-150 μm, and the conductor has a thickness of 10-200 μm. The conductor is made of silver, copper or aluminum.

The spiral initialization coils have the same width, and gaps between the windings are the same. The spiral initialization coil has a width of 0.12 mm, and the gap between the windings is 0.1 mm. The spiral initialization coil is made of copper or aluminum. The resistance and the inductance value of the spiral initialization coil are very small, so that the width of a current pulse will not cause a delay.

The magnetoresistive sensor chip uses a magnetic layer or a permanent magnet to provide a bias field perpendicular to a free layer of sensor elements in the sensor chip, and the magnetic field generated by the initialization coil is parallel to the direction of the bias field of the free layer f the sensor elements in the sensor chip.

As the PCB is used as the substrate, the spiral initialization coil can be disposed above the PCB board rather than on the sensor chip, and the sensor chips are formed above the spiral initialization coil. In FIG. 6, four sets of wire bonding pads 2 are further included. Each set of wire bonding pads is connected to pins of the ASIC specific integrated circuit 3. The pins of the ASIC specific integrated circuit 3 are connected to pins of magnetoresistive strips of magnetoresistive elements, and the direction of a pinning layer is as marked in FIG. 6.

In FIG. 6, the number of the sensor chips is 2. The spiral initialization coil 4 is rectangular. The sensor chips are located on two symmetrical sides of the spiral initialization coil 4 respectively to form a single sensing axis.

Figure 7:
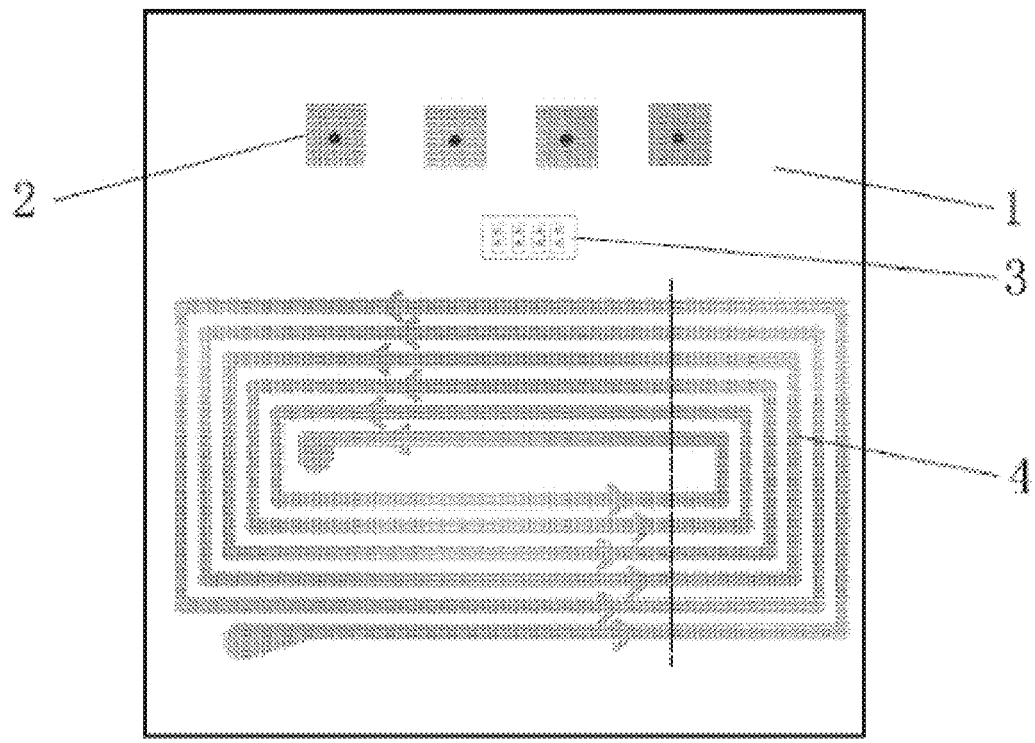
FIG. 7 is a schematic diagram of generating a magnetic field by a current, passing through a coil, of a magnetic field sensing device according to the present invention.
Figure 8:
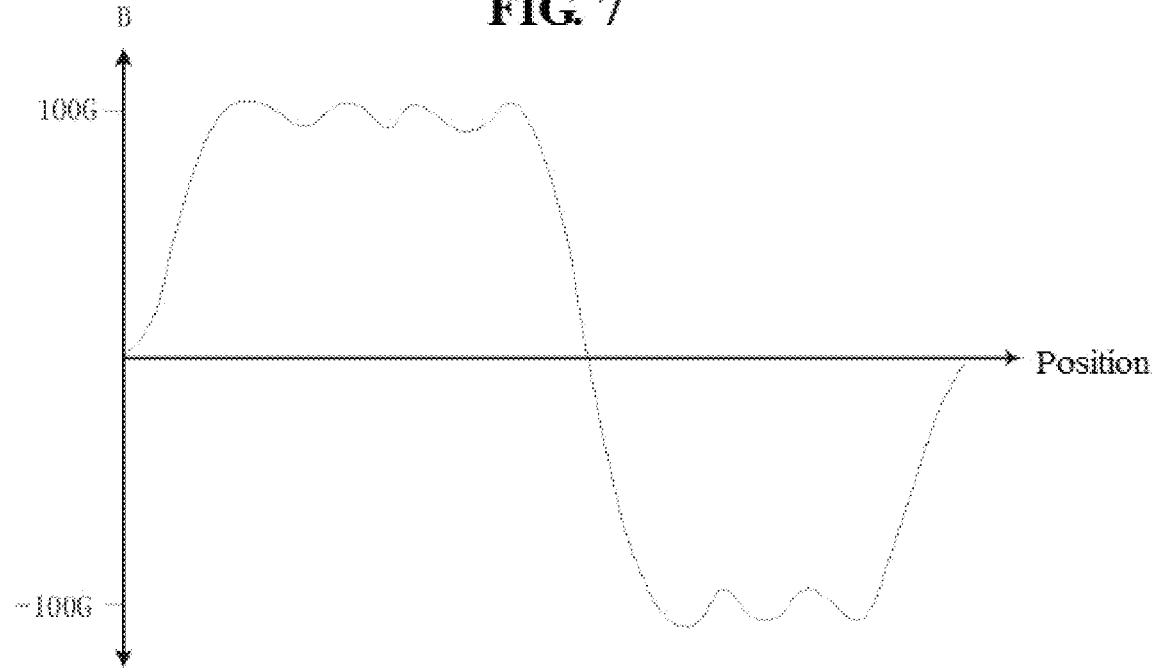
FIG. 8 is a schematic diagram of magnetic field distribution of a magnetic field sensing device according to the present invention.

A current is applied to the spiral initialization coil. As shown in FIG. 7, the current flows through the spiral initialization coil counterclockwise. As such, a magnetic field in an opposite direction will be generated in the spiral initialization coil. FIG. 8 is a schematic diagram of magnetic field distribution of a magnetic field sensing device according to the present invention. The magnetic field distribution is detected along the direction of the dotted line in FIG. 7. However, the magnetic field distribution needs to be further improved due to the rapid current pulse and the spacing distribution of the spiral initialization coil.

Figure 9:
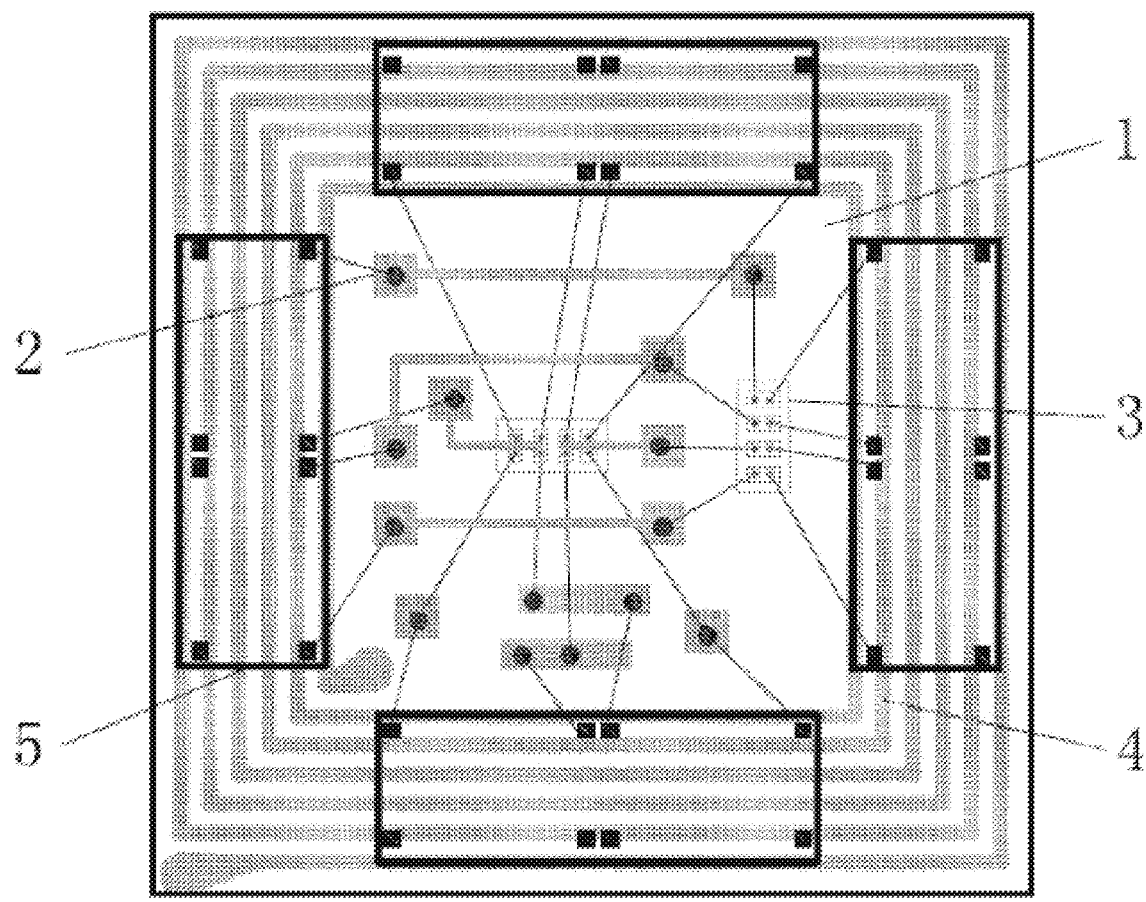
FIG. 9 is a schematic diagram of a magnetic field sensing device having double sensing axes according to the present invention.

FIG. 9 is a schematic diagram of a magnetic field sensing device having double sensing axes according to the present invention. The number of the sensor chips 5 is 4. The spiral initialization coil 4 is square. The sensor chips are located symmetrically and circumferentially along the surface of the spiral initialization coil respectively to form double sensing axes.

Figure 10:
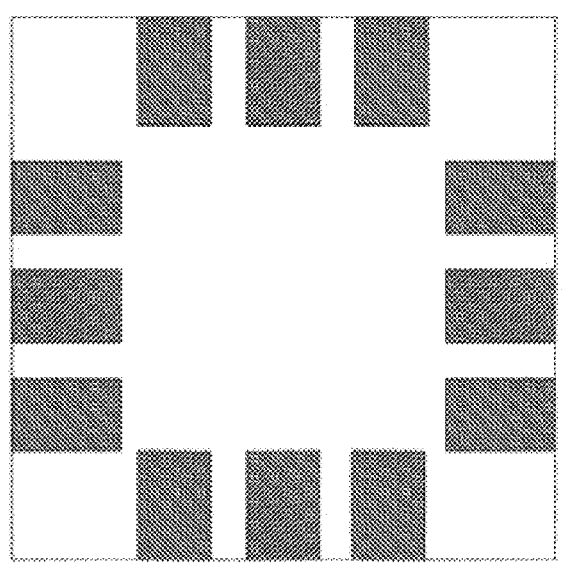
FIG. 10 is a schematic diagram of packaging of a magnetic field sensing device according to the present invention.

FIG. 10 is a schematic diagram of packaging of a magnetic field sensing device according to the present invention. Two difference design structures in FIG. 6 and FIG. 9 adopt the same packaging. The size of the packaging body is a structure of 6×6 mm. The bonding pads are equally spaced on the packaging body. The bonding pads have a length of 1.2.5 mm and have a width of 0.75 mm. The bonding pads are at a distance of 0.5 mm.

Figure 11:
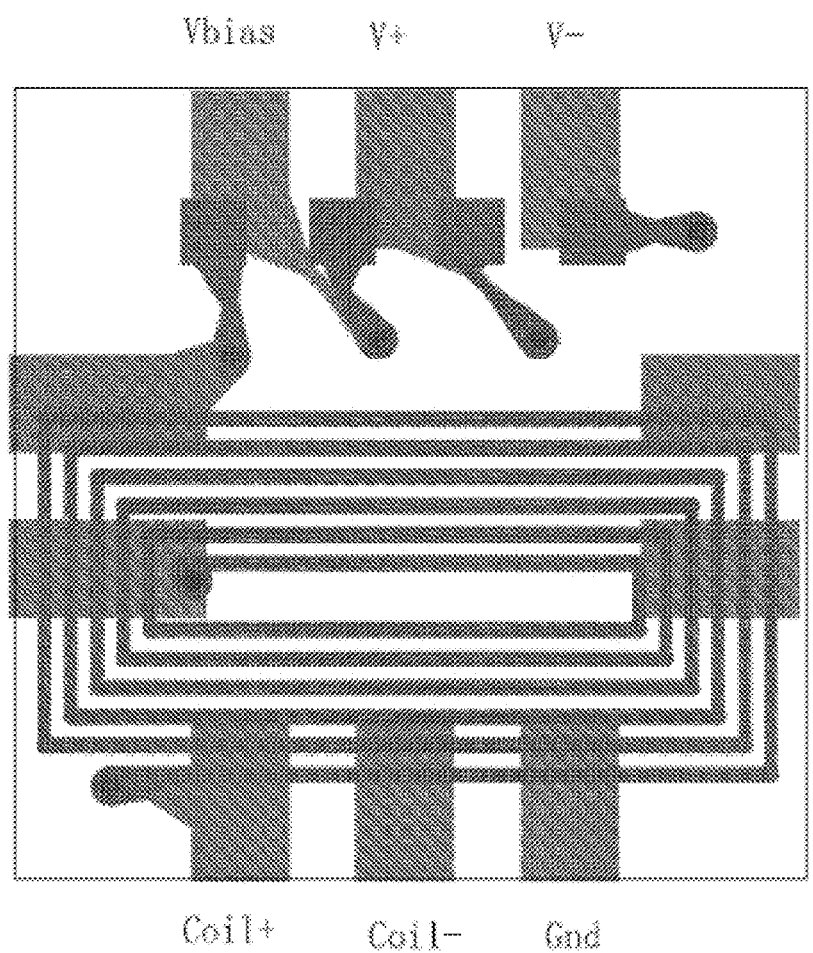
FIG. 11 is a schematic diagram of a substrate circuit of a magnetic field sensing device according to the present invention.

FIG. 11 is a schematic diagram of a substrate of a magnetic field sensing device according to the present invention. The substrate is divided into two layers, the spiral initialization coil is located on the top layer, and the bonding pads are located on the bottom layer.

The ASIC specific integrated circuit and the magnetoresistive sensor bridge are electrically interconnected. The wire bonding pad and the ASIC specific integrated circuit are electrically interconnected.

Preferably, the ASIC specific integrated circuit includes an ESD antistatic protection circuit.

Preferably, the ASIC specific integrated circuit includes an ESD antistatic protection circuit and a processing circuit configured to calculate output of the magnetoresistive sensor bridge to output in a digital form.

The packaging structure is LGA packaging.

The encapsulation layer is made of a non-magnetic material, and the magnetoresistive sensor bridge is sealed in the encapsulation layer to form standard semiconductor encapsulation. The non-magnetic material is plastic or ceramic.

Specific embodiments of the present invention are described above with reference to the accompanying drawings. It is apparent that lots of modifications can be made to the existing technologies and methods without departing from the scope and spirit of the present invention. In the technical field of the present invention, a variety of changes can be made within the scope of the technical content of the present invention as long as general knowledge is mastered.

The invention claimed is:

1. A magnetoresistive sensor, comprising:
a packaging structure;
at least one pair of sensor chips;
a substrate having a planar surface;
a planar-wound initialization coil configured and arranged with respect to the at least one pair of sensor chips to reduce hysteresis and offset, the planar-wound initialization coil having windings formed by a conductor on the planar surface of the substrate, the initialization coil having a coil center surrounded by each of the windings;
a set of wire bonding pads; and
an encapsulation layer over the substrate to encapsulate the initialization coil;
wherein the packaging structure comprises the substrate on which a conductor is patterned,
wherein each of the at least one pair of sensor chips comprises two sensor chips, wherein each of the sensor chips comprises two groups of magnetoresistive sensing unit strings, and the magnetoresistive sensing unit strings located on the sensor chip are connected to form a magnetoresistive sensor bridge,
wherein the sensor chips are located above the initialization coil and placed symmetrically on opposing sides of the coil center and circumferentially along the surface of the initialization coil and are not placed above the coil center, and a magnetic field generated by the initialization coil is perpendicular to the direction of a sensing axis of the sensor chips.

2. The magnetoresistive sensor according to claim 1, wherein the substrate of the packaging structure is a PCB.

3. The magnetoresistive sensor according to claim 1, wherein the initialization coil is rectangular, and two sensor chips are located on two symmetrical sides of the initialization coil respectively to form a single sensing axis.

4. The magnetoresistive sensor according to claim 1, wherein the initialization coil is square, and four sensor chips, are located symmetrically and circumferentially along the surface of the initialization coil respectively to form double sensing axes.

5. The magnetoresistive sensor according to claim 1, wherein the windings have the same width, and gaps between the windings are the same.

6. The magnetoresistive sensor according to claim 5, wherein the spiral initialization coil has a width of 0.12 mm, and the gap between the windings is 0.1 mm.

7. The magnetoresistive sensor according to claim 1, further comprising an ASIC specific integrated circuit, wherein said ASIC specific integrated circuit and the magnetoresistive sensor bridge are electrically interconnected, and the wire bonding pad and ASIC specific integrated circuit are electrically interconnected.

8. The magnetoresistive sensor according to claim 7, wherein the ASIC specific integrated circuit comprises an ESD antistatic protection circuit.

9. The magnetoresistive sensor according to claim 7, wherein the ASIC specific integrated circuit comprises an ESD antistatic protection circuit and a processing circuit configured to calculate output of the magnetoresistive sensor bridge to output in a digital form.

10. The magnetoresistive sensor according to claim 1, wherein the packaging structure is LGA packaging.

11. The magnetoresistive sensor according to claim 1, wherein the encapsulation layer is made of a non-magnetic material, and the magnetoresistive sensor bridge is sealed in the encapsulation layer to form standard semiconductor encapsulation.

12. The magnetoresistive sensor according to claim 11, wherein the non-magnetic material is plastic or ceramic.

13. The magnetoresistive sensor according to claim 1, wherein the magnetoresistive sensor chip uses a magnetic layer or a permanent magnet to provide a bias field perpendicular to a free layer of sensor elements in the sensor chip, and the magnetic field generated by the initialization coil is parallel to the direction of the bias field of the free layer of the sensor elements in the sensor chip.

14. The magnetoresistive sensor according to claim 1, wherein the initialization coil is made of copper or aluminum.

15. The magnetoresistive sensor according to claim 1, wherein the conductor is made of silver, copper or aluminum.

16. The magnetoresistive sensor according to claim 1, wherein the conductor has a width in a range of 50-300 μm, the spacing between the conductors is 50-150 μm, and the conductor has a thickness of 10-200 μm.

* * * * *

UNITED STATES PATENT AND TRADEMARK OFFICE
CERTIFICATE OF CORRECTION

PATENT NO. : 10,948,554 B2
APPLICATION NO. : 16/093064
DATED : March 16, 2021
INVENTOR(S) : Deak et al.

Page 1 of 1

It is certified that error appears in the above-identified patent and that said Letters Patent is hereby corrected as shown below:

In the Claims

In Column 6, Line 62, in Claim 4, delete "chips," and insert --chips-- therefor

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*